United States Patent [19]

Mikagi

[11] Patent Number: 5,751,067
[45] Date of Patent: May 12, 1998

[54] COMPACT SEMICONDUCTOR DEVICE HAVING EXCELLENT ELECTRICAL CHARACTERISTICS AND LONG TIME RELIABILITY

[75] Inventor: Kaoru Mikagi, Tokyo, Japan

[73] Assignee: NEC Corporation, Tokyo, Japan

[21] Appl. No.: 487,654

[22] Filed: Jun. 7, 1995

Related U.S. Application Data

[63] Continuation of Ser. No. 43,372, Apr. 2, 1993, abandoned.

[30] Foreign Application Priority Data

Apr. 2, 1992 [JP] Japan .................................. 4-080170

[51] Int. Cl.$^6$ .................................................. H01L 23/48
[52] U.S. Cl. .................................... 257/764; 257/768
[58] Field of Search .................................. 257/750, 751, 257/753, 758, 761–764, 766–770

[56] References Cited

U.S. PATENT DOCUMENTS

| | | | |
|---|---|---|---|
| 4,823,182 | 4/1989 | Okumura | 257/915 |
| 4,866,008 | 9/1989 | Brighton et al. | 437/189 |
| 4,924,281 | 5/1990 | Endo et al. | 257/757 |
| 5,003,375 | 3/1991 | Ichikawa | 257/755 |
| 5,132,775 | 7/1992 | Brighton et al. | 257/750 |
| 5,164,332 | 11/1992 | Kumar | 437/198 |
| 5,250,846 | 10/1993 | Kondo | 257/755 |
| 5,290,733 | 3/1994 | Hayasaka et al. | 437/194 |
| 5,332,693 | 7/1994 | Kim | 437/194 |
| 5,345,108 | 9/1994 | Kikkawa | 257/915 |
| 5,447,599 | 9/1995 | Li et al. | 216/17 |
| 5,459,353 | 10/1995 | Kanazawa | 257/915 |

FOREIGN PATENT DOCUMENTS

| | | | |
|---|---|---|---|
| 2139420 | 11/1984 | United Kingdom | 257/413 |

*Primary Examiner*—Mark V. Prenty
*Attorney, Agent, or Firm*—Sughrue, Mion, Zinn, Macpeak & Seas, PLLC

[57] ABSTRACT

In a semiconductor device which includes a semiconductor substrate, a first insulator layer on the substrate, a conductor pattern formed by a conductive material and arranged on the first insulator layer, the conductor pattern is overlaid by a reacted conductor layer reacted with the conductive material. The conductor pattern is protected by the reacted conductor layer from corrosion. Preferably, a second insulator layer is covered on the reacted conductor layer and is fixedly adhered to the conductor pattern.

2 Claims, 3 Drawing Sheets

COMPACT SEMICONDUCTOR DEVICE HAVING EXCELLENT ELECTRICAL CHARACTERISTICS AND LONG TIME RELIABILITY

This is a Continuation of application Ser. No. 08/043,372 filed Apr. 2, 1993, and now abandoned.

BACKGROUND OF THE INVENTION

The present invention relates to a semiconductor device which includes an electrical wiring used in an integrated circuit (IC) or a large scale integration (LSI) circuit and a method of manufacturing the semiconductor device.

A conventional semiconductor device of the type described comprises a semiconductor substrate, a first insulator layer on the semiconductor substrate, and a conductor pattern selectively deposited on the first insulator layer. The conductor pattern is formed by a conductive material, such as gold, copper, or the like and is operable as a wiring for connecting electronic elements, such as transistors, diodes, capacitors, to one another. In order to protect the conductor pattern, a second insulator layer is often overlaid on the first insulator layer and the conductor pattern.

Herein, it is assumed that the second insulator layer is overlaid on the conductor pattern of, for example, gold. In this event, the conductor pattern of gold is not strongly adhered to the second insulator layer because gold has a high chemical stability.

Accordingly, the conductor pattern of gold is easily removed or peeled off from the second insulator layer when a stress is imposed on the second insulator layer. Moreover, the conductor pattern of gold is very often removed from the second insulator layer due to a thermal stress which is given during a heat-treatment carried out in a later process of the semiconductor device manufacturing processes.

As a result, a yield in the semiconductor device manufacturing processes is not so good. In addition, the semiconductor device cannot keep a high reliability for a long time after it is completed as an end product. This gives rise not only to fluctuation of electrical characteristics of the end product but also to a breakage of the conductor pattern at contact portions of two layers. This also makes it difficult to apply a multilayer interconnection technique to the semiconductor device and to reduce the semiconductor device in size. Consequently, a high-performance can not be achieved by the semiconductor device manufactured in the above-mentioned manner.

On the other hand, in case that the conductor pattern is mainly formed by copper, the other disadvantages appear in the semiconductor device. Specifically, when the conductor pattern of copper is directly exposed to an atmosphere without a coat of a second insulator layer, the conductor pattern is quickly corroded, which finally results in a breakage of the conductor pattern. This also makes it difficult to keep a high reliability for a long time in the semiconductor device.

On the contrary, when the second insulator layer of $SiO_2$ is overlaid directly on the conductor pattern, the conductor pattern of copper reacts with the second insulator layer of $SiO_2$ due to heat imposed during heat-treatment in a later process of the semiconductor device manufacturing processes. As a result, such reaction or the copper with $SiO_2$ deteriorates electrical characteristics.

SUMMARY OF THE INVENTION

It is therefore an object of this invention to provide a semiconductor device which can accomplish excellent electrical characteristics.

It is another object of this invention to provide a semiconductor device of the type described, which can keep a high, reliability and a high performance for a long time.

Other objects of this invention will become clear as the description proceeds.

According to an aspect of this invention, the semiconductor device comprises a semiconductor substrate which has a principal surface, a first insulator layer which is formed on the principal surface, a conductor pattern which is formed by a conductive material and which is arranged on the first insulator layer, wherein the semiconductor device further includes a reacted conductor layer which is formed by a reacted material reacted with the conductive material and which is overlaid on at least a part of the conductor pattern.

The semiconductor device may further include a second insulator layer which overlies the first insulator layer and the reacted conductor layer.

According to another aspect of this invention, a method of manufacturing the semiconductor device of the type described in provided. It comprises the steps of: preparing a semiconductor substrate having a principal surface, forming a first insulator layer on the principal surface, selectively depositing a conductor pattern of a conductive material on the first insulator layer, coating the conductor pattern with a conductor layer of a reactive material reactive to the conductive material, and making the reactive material react with the conductive material to partially render the conductor layer into a reacted conductor layer.

The selective conductor pattern depositing step may further comprise the steps of: selectively forming a first conductor layer on the first insulator layer, forming a second conductor layer on the first conductor layer, and depositing a metal-plated third conductor layer on the second conductor layer by electroplating.

DESCRIPTION OF THE PREFERRED EMBODIMENT

Referring to FIG. 1, a method of manufacturing a conventional semiconductor device will first be described for a better understanding of this invention.

Figure 1A:
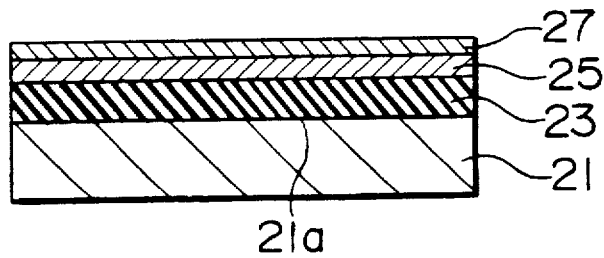
FIGS. 1(A) to (D) are schematic vertical sectional views of a semiconductor device at various steps of a method of manufacturing a conventional semiconductor device.

As illustrated in FIG. 1(A), a semiconductor substrate 21 of silicon is prepared in a known manner and has the principal surface 21a which is directed upwards of FIG. 1. The first insulator layer 23 of silicon oxide is then deposited on the principal surface 21a to a thickness of about 500 nm by either a thermal oxidation method or a plasma CVD method which uses $SiH_4$ and $N_2O$.

A first conductor lamina 25 is deposited on the first insulator layer 23 to a thickness of about 100 nm by DC magnetron sputtering of a titanium-tungsten alloy which includes 10 wt % titanium. The DC magnetron sputtering is carried out on conditions that the pressure is held at 2 through 10m Torr and that the power is set at 1.0 through 2.0 kw.

A second conductor lamina 27 of Au (or Pt, Pd, Rh) is deposited on the first conductor lamina 25 to a thickness between about 10 and 50 nm by the same sputtering of each metal as that of the above mentioned first conductor lamina 25. This sputtering is carried out on conditions that the pressure is held at 2 through 10m Torr and that the power is set at 0.2 through 1.0 kw.

Figure 1B:
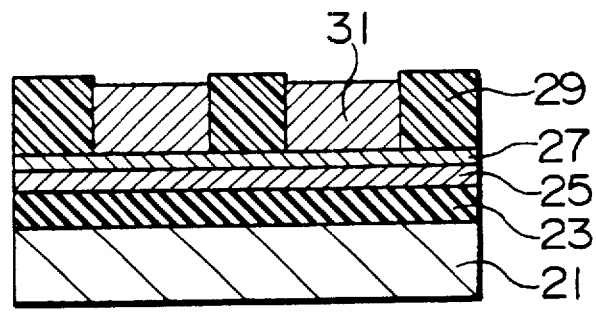

After deposition of the second conductor lamina 27, a photoresist (not shown) is coated on the second conductor lamina 27 to a thickness between 1 and 2 micron meters to be thereafter patterned and to be selectively left on the second conductor lamina 27 as photoresist layers 29 by the use of a photolithography of g-rays or i-rays. A gold-plated layer 31 is deposited to a thickness between 0.5 and 1.5 micron meters by electroplating on exposed areas of the second conductor lamina 27 and the photoresist layers 29, as illustrated in FIG. 1(B).

Third, the photoresist layers 29 are removed from the second conductor lamina 27 by a wet etching which may be made by the use of either an organic solvent or an oxygen plasma. As a result, the second conductor lamina 27 are selectively exposed to an atmosphere.

Thereafter, exposed areas of the second conductor lamina 27 are selectively etched off together with the first conductor lamina 25. In this event, the gold-plated third conductor layer 31 is operable as an etching mask. At any rate, the first and the second conductor laminae 25 and 27 are selectively left on the first insulator layer 23 in the form of first and second conductor layers 25' and 27' which are covered with the gold-plated third conductor layer 31. Thus, the first conductor layer 25', the second conductor layer 27', and the gold-plated layer 31 remain on the first insulator layer 23 and form a conductor pattern 33 which serves as a wiring among electronic elements (not shown).

The first conductor layer 25' serves as a barrier metal which avoids diffusion or migration of the second conductor layer 27' and the gold-plated third conductor layer 31 into active regions formed in the semiconductor substrate 21. The first conductor layer 25' is also helpful to fixedly adhere the conductor pattern 33 to the first insulator layer 23.

On the other hand, the second conductor lamina 27 serves as an electrode on electroplating of gold-plated third conductor layer 31. In other words, electric current is caused to flow through the second conductor lamina 27. In addition, the second conductor lamina 27 acts to protect the first conductor lamina 25 from electrolytic solution for electroplating. In any event, the second conductor layer 27' is effective to adhere the gold-plated third conductor layer 31 to the primary conductor layer 25'.

Figure 1C:
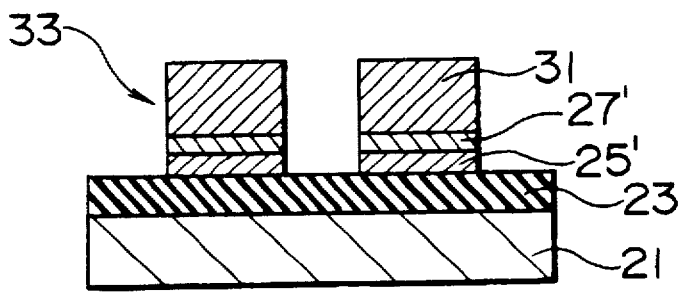
Figure 1D:
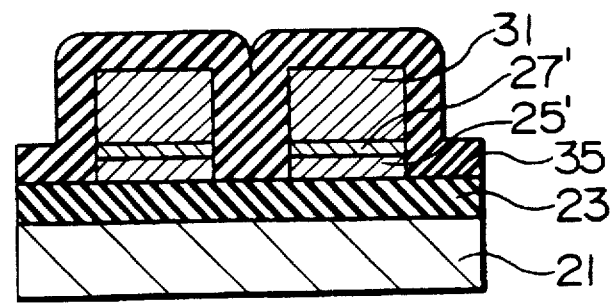

In order to protect the conductor pattern 33, a second insulator layer is often overlaid on exposed portions of the first insulator layer 23 and the conductor pattern 33, as illustrated in FIG. 1(D).

More specifically, the second insulator layer 35 of silicon nitride is coated on the exposed portions of the first insulator layer 23 and the conductor pattern 33 to a thickness between 0.5 and 1.0 micron meter by a plasma CVD method which is carried out by the use of a reactive gas, such as $SiH_4$ and $NH_3$.

However, the conductor pattern 33 is often removed or peeled off from the second insulator layer 35, as described in the preamble of the instant specification. Accordingly, the conventional semiconductor device cannot keep a high reliability for a long time. Further, a high-performance cannot be achieved by the conventional semiconductor device manufactured in the above-mentioned manner because of high dielectric constant of silicon nitride.

Referring now to FIGS. 2(A) to (D), the description will proceed to a method of manufacturing a semiconductor device according to a first embodiment of this invention. Similar parts are designated by like reference numerals.

Figure 2A:
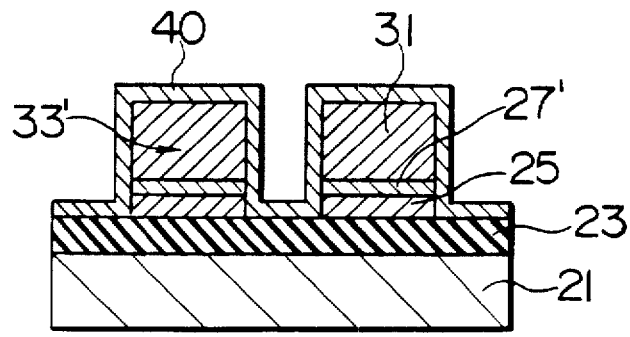
FIGS. 2(A) to (D) are schematic vertical sectional views of a semiconductor device at various steps of a method according to a first embodiment of this invention.

In FIG. 2(A), the semiconductor device according to the first embodiment of this invention is fabricated by processes similar to those illustrated in FIGS. 1(A) to (C) except that the thickness of the second conductor layer 27' is thinner than that illustrated in FIG. 1 and is as thin as about 20 through 50 nm.

As mentioned with respect to the conventional semiconductor device, the first conductor layer 25' serves as a barrier metal which prevents the second conductor layer 27' and the gold-plated third conductor layer 31 from being diffused into active regions. The first conductor layer 25' also serves to adhere the conductor pattern 33 to the first insulator layer 23. A material of the primary conductor layer 25' is therefore not limited to Ti-W but may be selected in consideration of heat-resistance and adherence to silicon oxide.

More specifically, the first conductor layer 25' may be formed by a single layer of a material selected from a group consisting of W, Ti, Mo, Zr, V, Hf, Ta, Cr, Nb, and an alloy including a combination of at least two metals enumerated above.

Alternatively, the single layer may be silicon compounds, nitrogen compounds, boron compounds, or carbon compounds, each compound including a metal or an alloy selected from a group of W, Ti, Mo, Zr, V, Ta, Cr, Nb, and Hf.

Furthermore, the first conductor layer 25' may also be formed by double layers one of which is made of Ti and another one of which is made of nitrogen compounds of N and Ti. Alternatively, one of the double layers may be made of Ti and another layer may be made of boron compounds of B and Ti.

As mentioned with respect to the conventional semiconductor device, the second conductor layer 27' acts as an electrode for causing a current to flow therethrough on deposition of the gold-plated third conductor layer 31 by electroplating and serves to protect the first conductor layer 25' from electrolytic solution for electroplating. In addition, the second conductor layer 27' is also effective to adhere the gold-plated third conductor layer 31 to the first conductor layer 25'. A material of the second conductor layer 27' is therefore not limited to Au but may be selected from a group consisting of Pd, Pt, Os, Ir, Rh, Ru, Re, Ti, Cu, V, Cr, Zr, Nb, Mo, Hf, Ta, W, and an alloy including at least two metals enumerated above. Any other materials except the above-mentioned materials can be used as the material of the second conductor layer 27', provided that the material has properties matched with the gold-plated third conductor layer 31 in connection with heat-resistance, adherence to the first conductor layer 25', relevance of the material as a cathode used in the electroplating, and the like.

During electroplating of the gold-plated third conductor layer 31, the current is caused to flow through the second conductor layer 27' of Au and the first conductor layer 25' of Ti-W) to the electrolytic solution. The electrolytic solution may comprise $H_2SO_4$, gold sulfate natrium, and a flattener, PH-stabilizer, etc. Alternatively, the electrolytic solution may be a non-cyanic one which generally includes a gold of about 10 g per one litter and which has a controlled PH value between 6 and 8 close to neutrality. It is desirable that the electroplating is carried out on conditions that a temperature is kept at 35° C. through 60° C. and that current density is held at 1 through 4 $mA/cm^2$.

As mentioned before in respect of FIGS. 1(A) to (C), the exposed areas of the second conductor lamina 27 and the first conductor lamina 25 are subjected to wet etching through the gold-plated third conductor layer 31 to leave a conductor pattern 33 on the first insulator layer 23. During the wet etching, the exposed areas of the second conductor lamina 27 are etched by an aqua regia of 10 through 20 vol % which is kept at a temperature between 25° C. through 50° C. On the other hand, the exposed area of the first conductor lamina 25 is etched by a hydrogen peroxide of 50 through 100 vol % which is kept at a temperature between 25° C. and 45° C.

With such a manner of the wet etching, it is achieved that the conductor pattern 33 is well configured with few side etches.

However, a surface of the gold-plated third conductor layer 31 is slightly etched during the above-mentioned etching. It is desirable that the thickness of the gold-plated third conductor layer 31 is predetermined in consideration of an amount of etching of the gold-plated third conductor layer 31.

The wet etching is helpful to minimize an amount of etching of the gold-plated third conductor layer 31 and to avoid a physical damage of the gold-plated third conductor layer 31, as compared with a dry etching method.

After the etching, the conductor pattern 33' is then coated with a fourth conductor layer 40, as shown in FIG. 2(A). The fourth conductor layer 40 is composed of a material which is reactive to the material, namely, Au of the gold-plated third conductor layer 31 and which may be, for example, Ti-W. The fourth conductor layer 40 of Ti-W is deposited on the conductor pattern 33' to a thickness between 20 nm and 50 nm by D.C. magnetron sputtering.

Figure 2B:
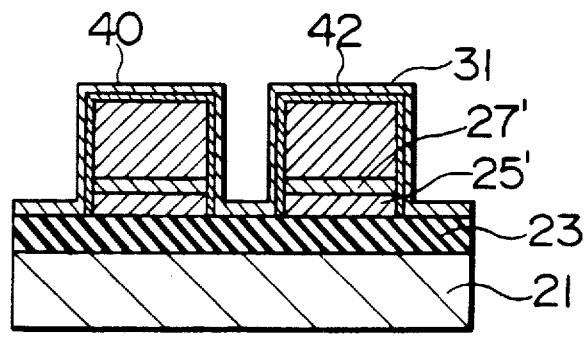

As illustrated in FIG. 2(B), the fourth conductor layer 40 is heated up to 250° C. through 450° C. for 20 through 60 minutes at a non-reactive or a low-pressured atmosphere to make the reactive material of Ti and W react with the Au. During this heat treatment, the fourth conductor layer 40 is partially rendered into a reacted conductor layer 42, because atoms of Ti, W and Au are diffused or migrated to each other. In this case, Ti atoms become dominant diffusion species and form Au-Ti compounds such as $TiAu_4$, $TiAu_2$, TiAu, and $Ti_3Au$ by reacting with Au. The content of Ti in Ti-W is low and shallow reacted conductor layer was formed. Therefore, electrical characteristics of Au would not be deteriorated. The diffusion distance of W atoms into Au is very shallow, which does not affect electrical characteristics and adhesion to insulator. A composition of the reacted conductor layer 42 depends on the heat-treatment condition. Specifically, it is necessary that the heat-treatment conditions is determined in accordance with characteristics and standards which are requested for either an end product of the semiconductor device or the processes of manufacturing the same.

Figure 2C:
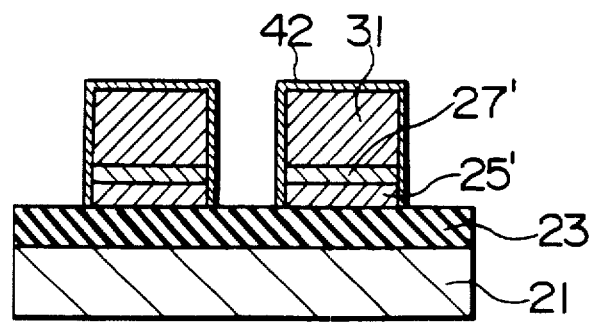

As illustrated in FIG. 2(C), non-reacted portions of the fourth conductor layer 40 is etched by reactive ion etching to be removed by $CF_4$ gas chemistry. Althrough Ti-w is used as the reactive material of the fourth conductor 40 in this embodiment, the material is not limited to Ti-W, the fourth conductor layer 40 may be formed by a material which reacts with Au to form a reacted conductor layer 42 and which is well adhered to a second insulator layer 35' as will presently be described. More particularly, the fourth conductor layer 40 may be given by Ti, Zr, Hf, V, Nb, Ta, Mo, W, Co, Ni, Cr, or an alloy including at least two metals selected from the above except for Ti-W. Alternatively, it may also be of silicon compounds, nitrogen compounds, or boron compounds including a metal or an alloy selected from Ti, Zr, Hf, V, Nb, Ta, Mo, W, Co, Cr, and Ni.

Figure 2D:
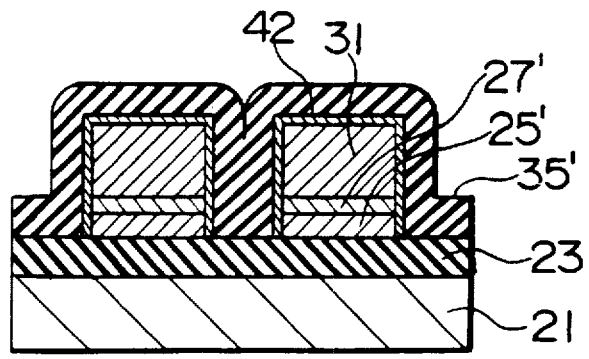

As illustrated in FIG. 2(D), the second insulator layer 35' of silicon oxide is overlaid on the first insulator layer 23 and the conductor pattern 33' to a thickness between 0.5 and 1.0 micron meter by a plasma CVD method in which $SiH_4$ and $N_2O$ are used as a reactive gas.

Herein, the material of the second insulator layer 35' is not limited to silicon oxide but may be, for example, silicate glass including phosphorous or boron silicate such as PSG, BSG, BPSG, silicon nitride, silicon oxide nitride, and an organic layer including polyimide resin.

In addition, the depositing method of the second insulator layer 35' is also not limited to the aforesaid plasma CVD but may be, for example, a spin on glass (SOG) method, a spin coating method generally used for the organic layer including polyimide resin or the like. Further, it may be more efficient to combine flattening the second insulator layer 35' representative of an etchback method of an insulating layer in which a reactive ion etching is utilized.

Besides, the reactive material of Ti-W also reacts with both the first conductor layer 25' and the second conductor layer 27' to provide a portion of the reacted conductor layer 42. The portion of the reacted conductor layer 42 which is reacted with the first and the second conductor layers 25' and 27' has little connection with electrical characteristics or adherence to the second insulator layer 35'.

Thus, in the above-described first embodiment of this invention, the conductor pattern 33' is overlaid by the reacted conductor layer 42 which is formed by the reacted material reacted with the conductive material of Au. Herein, it is noted that Ti-W exhibits a good adhesiveness to the second insulator layer 35' of silicon oxide, as compared with Au. Accordingly, the conductor pattern 33' is not removed or peeled off from the second insulator layer 35' even when any stresses are imposed on the second insulator layer 35'. Besides, it should be noted that the reacted conductor layer 42 is very thin in comparison with the thickness of the conductor pattern 33'. Consequently, existence of the reacted conductor layer 42 does not almost influence a resistance value of the conductor pattern 33'.

This means that a yield is improved on manufacturing the semiconductor device. In addition, the semiconductor device thus manufactured is able to keep a high reliability for a long time and has excellent electrical characteristics after it is completed as an end product. Furthermore, this makes it possible to apply a multilayer interconnection technique to the semiconductor device and to reduce the semiconductor device in size.

In the above-mentioned embodiment, the wet etching method is employed to remove the exposed areas of the first and the second conductor laminae 25 and 27. This makes an advantage that the reacted conductor layer 42 is stably formed on the surface of the gold-plated third conductor layer 31. However, selection of a method to remove the exposed areas depends on a kind of each conductor lamina 25 or 27. For example, the above-mentioned wet etching method can be replaced by a dry etching method or a combination of dry and wet etching methods, when such methods are suitable to remove the exposed areas in view of the materials of the first and the second conductor laminae 25 and 27. To say concretely, the second conductor lamina 27 is, in a case, readily removed by a physical etching, such as an ion milling, rather than a chemical etching, such as the above-mentioned wet etching. As an example to remove the first conductor lamina 25 with the dry etching, a reactive ion etching is considerable. In the reactive ion etching, fluoro gas, such as $CF_4$ or $SF_6$, may be used, when W or the like is used as a material of the first conductor lamina 25. On the contrary, chlorine gas, such as $CCL_4$ or $BCL_3$, may be used, when Ti or the like is used.

Figure 3A:
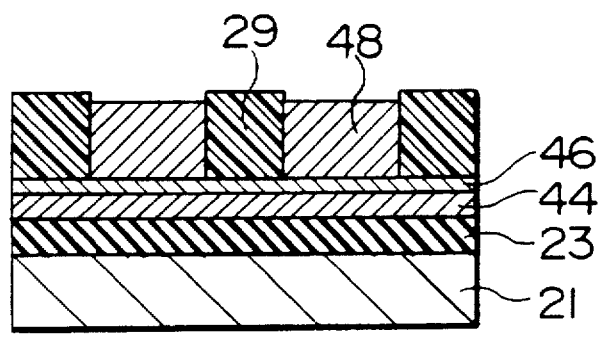
FIGS. 3(A) to (D) are schematic vertical sectional views of a semiconductor device at various steps of a method according to a second embodiment of this invention.

Referring to FIGS. 3(A) to (D), description will proceed to a method of manufacturing the semiconductor device according to a second embodiment of this invention. The method according to the second embodiment is similar to that of the first embodiment except for the followings. In FIG. 3(A), a first conductor lamina 44 is formed by D.C. magnetron sputtering of a Ti-W alloy which includes 10 wt % Ti.

The second conductor lamina 46 is composed of Cu and is then formed on the first conductor lamina 44 to a thickness of about 20 through 100 nm. The material of the second conductor lamina 46 is not limited to Cu. Any materials other than Cu can be used as the material thereof, provided that the material is matched with a Cu-plated layer in view of heat-resistance, suitability as a cathode in the electroplating, and the like. Furthermore, photoresist patterns 29 are selectively left on the second conductor lamina 46 by coating a photoresist layer of 0.5 through 1.0 micron meter and by patterning the photoresist layer in a known manner. Furthermore, a copper-plated third conductor layer 48 is selectively deposited on exposed areas of the second conductor lamina 46 to a thickness of 0.5 through 1.5 micron meters by an electroplating.

In the electroplating of Cu, it is important to deposit the Cu-plated third conductor layer 48 uniformly on the second conductor lamina 46. In order to acquire a high uniformity of the Cu-plated third conductor layer 48, the electrolytic solution may include $CuSO_4$ of 60 through 100 g/l, a metallic Cu of 15 through 25 g/l, $H_2SO_4$ of 170 through 220 g/l, a few chlorines, and additives of a flattener. In order to form a very flat and uniform Cu-plated third conductor layer 48, it is desirable that the electroplating is carried out on conditions that the temperature is kept at 20° C. through 30° C. and that the current density is held at 1 through 3 mA/cm².

Figure 3B:
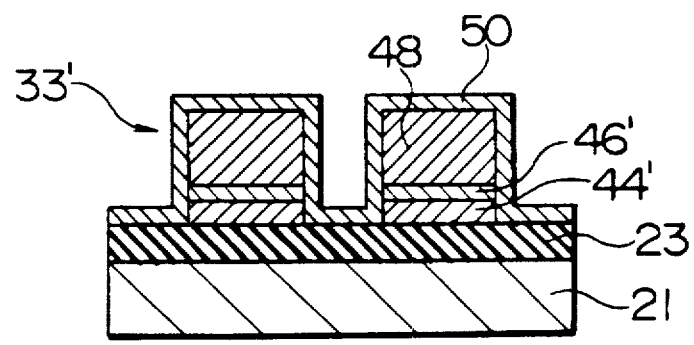
Figure 3C:
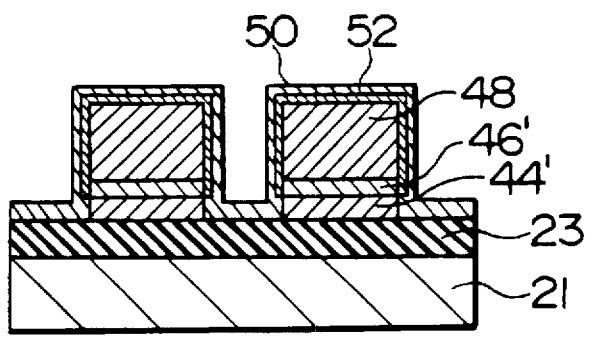

As illustrated in FIG. 3(B), the second and the first conductor laminae 46 and 44 are partially covered by the Cu-plated third conductor layer 48 with the second and the primary conductor laminae 46 and 44 partially uncovered or exposed by the Cu-plated third conductor layer 48. The exposed areas of the second conductor lamina 46 and the first conductor lamina 44 are removed so as to form a second conductor layer 46' and a first conductor layer 44' by a reactive ion etching which is carried out by the use of a fluoro gas, such as $CF_4$ or $SF_6$. It may be preferable that the exposed areas of the second and the primary conductor laminae 44 and 46 are successively removed in the same atmosphere by consecutive etching.

In this embodiment, although the exposed areas of the second and the first conductor laminae 44 and 46 are removed by dry etching, they may be removed by wet etching or by a combination of the dry etching and the wet etching. On the wet etching, the exposed areas of the second conductor lamina 46 may be etched off by using a solution including nitric acid and phosphoric acid while the exposed areas of the primary conductor layer 44 is etched off by using a solution of $H_2O_2$ or one including ammonia in addition to the $H_2O_2$.

As mentioned in connection with the gold-plated third conductor layer 31 in the first embodiment, the copper-plated third conductor layer 48 is also slightly etched during etching. It is therefore desirable that the thickness of the copper-plated third conductor layer 48 is predetermined in consideration of an amount of etching of the copper-plated third conductor layer 48.

In this embodiment, the conductor pattern 33' is then coated with the fourth conductor layer 50 of Zr which is reactive to the copper-plated third conductor layer 48, as illustrated in FIG. 3(B).

Next, the fourth conductor layer 50 is heated in a non-active or a vacuum atmosphere to make the reactive material of Zr react with the Cu. During this heat-treatment, the fourth conductor layer 50 is partially rendered into a reacted conductor layer 52.

The reacted conductor layer 52 is therefore overlaid only on the copper-plated third conductor layer 48 and the second conductor layer 46'. However, it is sufficiently achieved that the conductor pattern 33' is adhered to the second insulator layer 35' and that the semiconductor device has excellent electrical characteristics.

On the other hand, Zr is superior to Cu in corrosion-resistance and heat-resistance. Therefore, the existence of the reacted conductor layer 52 is effective to prevent the copper-plated third conductor layer 48 from reacting with the second insulator layer 35' and from corroding itself. The composition of the reacted conductor layer 52 may be considerable to be a solid solution of Zr and Cu, $Zr_2Cu$, $ZrCu$, $Zr_2Cu_3$, $ZrCu_3$, and the like.

Figure 3D:
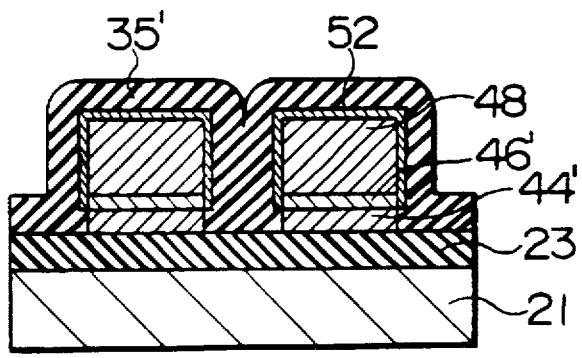

Furthermore, as illustrated in FIG. 3(D), non-reacted portions of the fourth conductor layer 50 of Zr is selectively removed by wet etching within solution including $HNO_3$, HF, and $H_2O_2$ at a temperature of 25° C. to 50° C. In this process, since the first conductor layer 44' of Ti-W is also etched by this solution, etching conditions should be carefully determined so that side etching of the conductor pattern 33' and the resultant peeling off can be avoided during the etching.

Thus, in the above-described second embodiment of this invention, the conductor pattern 33' is overlaid by the reacted conductor layer 52 of Zr which is formed by the material reacted with the conductive material of Cu. Herein, it is noted that Zr has a high corrosion-resistant characteristic, as compared with Cu, although Zr is less reactive than Cu to the second insulator layer 35', such as silicon oxide, silicon nitride, or the like. Accordingly, in the semiconductor device according to the second embodiment, the conductor pattern 33' is not corroded after it is manufactured. Furthermore, the conductor pattern 33' does not react with the second insulator layer 35', when such an insulator layer is overlaid on the conductor pattern 33'.

As a result, a yield for manufacturing the semiconductor device is improved in comparison with the conventional method. In addition, the semiconductor device is capable of keeping a high reliability for a long time and has excellent electrical characteristics after it is completed as an end product.

While this invention has thus far been described in conjunction with a few embodiments thereof, it will readily be possible for those skilled in the art to put this invention into practice in various other manners. For example, a material of the metal-plated layer is not restricted to either Au or Cu but may be replaced by Ag.

On the other hand, this invention can be applied to various kinds of semiconductor devices, such as MOS transistors, BI-POLAR transistors, and so on.

What is claimed is:

1. A semiconductor device comprising:

a semiconductor substrate having a principal surface;

an insulator layer which is formed on said principal surface;

a first conductor layer which is formed on said insulator layer with a partial area of said insulator layer exposed around said first conductor layer;

a second conductor layer which is stacked on said first conductor layer;

a third conductor layer which is deposited on said second conductor layer and which has an upper portion and a side portion;

a fourth conductor layer which is formed on said third conductor layer; and a reacted layer which is overlaid on at least said upper and side portions of said third conductor layer and is formed by reaction between said third and said fourth conductor layers;

wherein said fourth conductor layer is formed by nitrogen compounds including a metal selected from a group consisting of Ti, Zr, Hf, V, Nb, Ta, Cr, Mo, W, Co, and Ni.

2. A semiconductor device comprising:

a semiconductor substrate having a principal surface;

an insulator layer which is formed on said principal surface;

a first conductor layer which is formed on said insulator layer with a partial area of said insulator layer exposed around said first conductor layer;

a second conductor layer which is stacked on said first conductor layer;

a third conductor layer which is deposited on said second conductor layer and which has an upper portion and a side portion;

a fourth conductor layer which is formed on said third conductor layer; and a reacted layer which is overlaid on at least said upper and side portions of said third conductor layer and is formed by reaction between said third and said fourth conductor layers;

wherein said fourth conductor layer is formed by boron compounds including a metal selected from a group consisting of Ti, Zr, Hf, V, Nb, Ta, Cr, Mo, W, Co, and Ni.

* * * * *